United States Patent
Pawlowski

(10) Patent No.: US 11,289,137 B2
(45) Date of Patent: Mar. 29, 2022

(54) MULTI-PORT STORAGE-CLASS MEMORY INTERFACE

(71) Applicant: Micron Technology, Inc., Boise, ID (US)

(72) Inventor: Joseph Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/171,831

(22) Filed: Oct. 26, 2018

(65) Prior Publication Data

US 2019/0147923 A1   May 16, 2019

Related U.S. Application Data

(60) Provisional application No. 62/587,026, filed on Nov. 16, 2017.

(51) Int. Cl.

| | | |
|---|---|---|
| *G11C 7/10* | (2006.01) | |
| *H04L 47/10* | (2022.01) | |
| *G06F 13/18* | (2006.01) | |
| *G06F 13/16* | (2006.01) | |

(52) U.S. Cl.
CPC ............ *G11C 7/1075* (2013.01); *G06F 13/16* (2013.01); *G06F 13/18* (2013.01); *H04L 47/10* (2013.01)

(58) Field of Classification Search
None
See application file for complete search history.

(56) References Cited

U.S. PATENT DOCUMENTS

| | | | | |
|---|---|---|---|---|
| 8,631,206 | B1* | 1/2014 | O'Bleness | G06F 12/0864 711/128 |
| 8,650,379 | B2* | 2/2014 | Yang | G06F 12/0246 365/185.33 |
| 9,256,531 | B2* | 2/2016 | Cho | G06F 12/0607 |
| 10,003,675 | B2* | 6/2018 | Curewitz | G06F 3/061 |
| 2010/0057984 | A1* | 3/2010 | Chen | G06F 12/0897 711/113 |
| 2012/0079172 | A1* | 3/2012 | Yoshida | G06F 12/0607 711/103 |
| 2012/0096215 | A1* | 4/2012 | Zhang | G06F 12/0607 711/103 |
| 2012/0144082 | A1* | 6/2012 | Romero | G06F 3/061 710/300 |
| 2016/0232103 | A1* | 8/2016 | Schmisseur | G06F 3/0659 |
| 2018/0217778 | A1* | 8/2018 | Kusbel | G06F 3/061 |

* cited by examiner

*Primary Examiner* — Elias Mamo
(74) *Attorney, Agent, or Firm* — Holland & Hart LLP

(57) ABSTRACT

Methods, systems, and devices for a multi-port storage-class memory interface are described. A memory controller of the storage-class memory subsystem may receive, from a host device, a request associated with host addresses. The memory controller may generate interleaved addresses with a low latency based on the host addresses. The interleaved addresses parallelize processing of the request utilizing a set of memory media ports. Each memory media port of the set of memory media port may operate independent of each other to obtain a desired aggregated data transfer rate and a memory capacity. The interleaved address may leave no gaps in memory space. The memory controller may control a wear-leveling operation to distribute access operations across one or more zones of the memory media port.

21 Claims, 8 Drawing Sheets

MULTI-PORT STORAGE-CLASS MEMORY INTERFACE

CROSS REFERENCE

The present Application for Patent claims priority to U.S. Provisional Patent Application No. 62/587,026 by Pawlowski, entitled "MULTI-PORT STORAGE-CLASS MEMORY INTERFACE" filed Nov. 16, 2017, which is assigned to the assignee hereof and is expressly incorporated by reference in its entirety.

BACKGROUND

The following relates generally to operating a memory subsystem or system and more specifically to a multi-port storage-class memory interface.

A computing system may include a memory subsystem comprising various kinds of memory devices and controllers that are coupled with one or more buses to manage information in numerous electronic devices such as computers, wireless communication devices, internet of things, cameras, digital displays, and the like. Memory devices are widely used to store information in such electronic devices. Information is stored by programing different states of a memory device. For example, binary devices have two states, often denoted by a logic "1" or a logic "0." In other systems, more than two states may be stored in memory devices. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, not-AND (NAND) memory, change memory (PCM), and others. Memory devices may be volatile or non-volatile. Non-volatile memory cells may maintain their stored logic state for extended periods of time even in the absence of an external power source. Volatile memory cells (e.g., DRAM cells) may lose their stored state over time unless they are periodically refreshed by an external power source.

Improving a computing system may include enhancing a memory subsystem's performance such as reducing power consumption, increasing memory capacity, improving read/write speeds, providing non-volatility by use of persistent memory media, or reducing manufacturing costs at a certain performance point, among other metrics. Reducing a read latency while maintaining a data unit granularity may be desirable to improve a memory subsystem.

DETAILED DESCRIPTION

Figure 1:
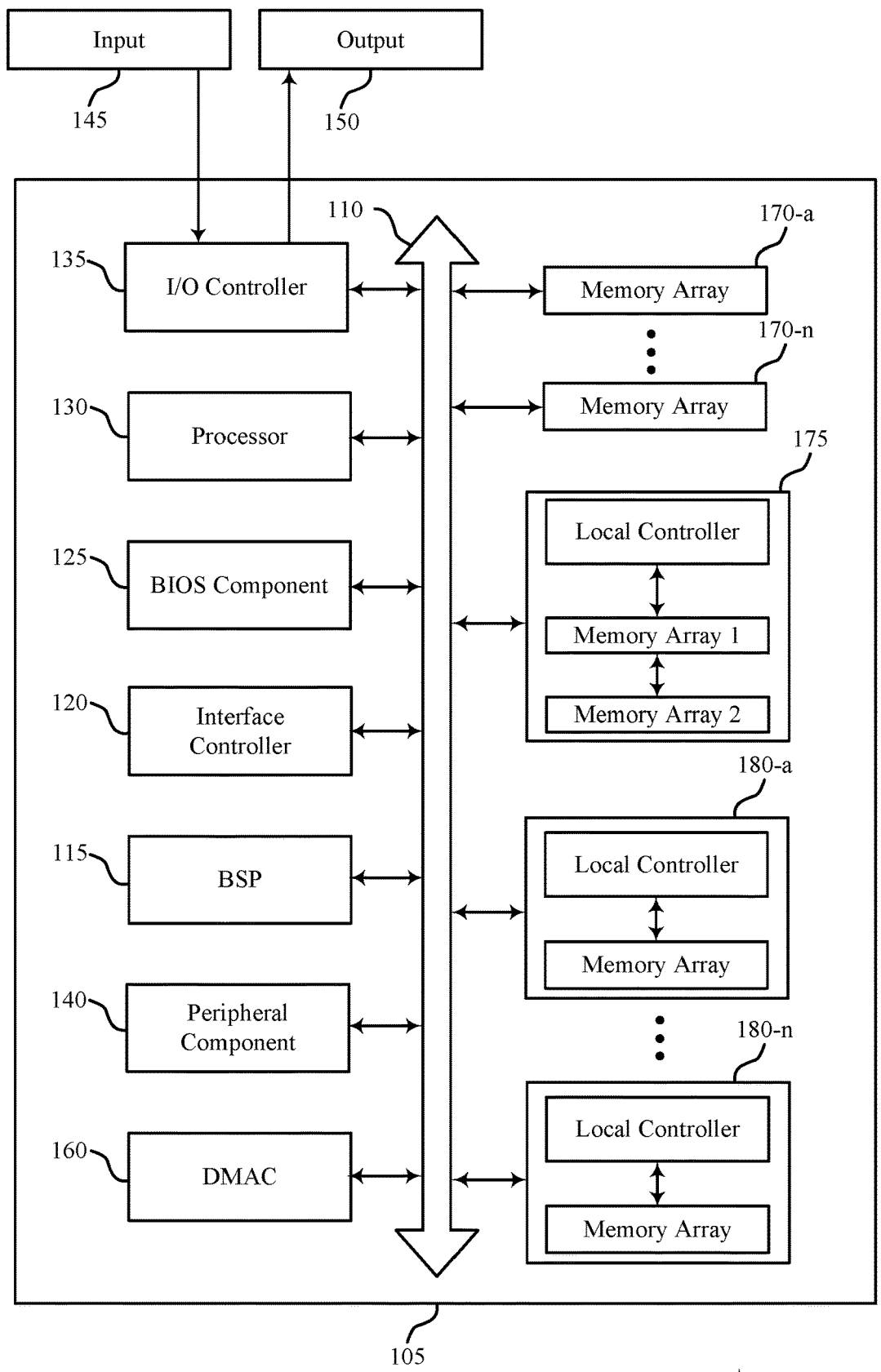
FIG. 1 illustrates an example of a computing system that supports a multi-port storage-class memory interface in accordance with examples of the present disclosure.

Performance of a computing system (e.g., a server including a memory subsystem) may depend on various factors associated with supplying information to the computing system. In some cases, one of the factors may be memory capacity. For example, it may be desirable to have a large memory capacity associated with a server. A larger memory capacity generally means a better server performance, such as running more virtual machines on physical hardware. Actual memory capacity in a server environment, however, may be limited by considerations such as a fixed number of memory channels available for a processor (e.g., central processing unit (CPU)), a power consumption by a memory subsystem, and a cost of a memory subsystem, among others.

An additional factor may be a latency (e.g., a load-to-use latency). A latency in a memory subsystem may refer to a time to make a unit of data available to a processor which requested the data. Such latency may be associated with several tasks, including searching internal registers or cache memory space in the processor, communicating with a network and finding a memory controller to search memory media coupled with the network, or accessing a solid-state drive (SSD) or a hard disk drive (HDD). By way of example, a memory subsystem may exhibit a latency in a few hundred nanoseconds (e.g., 100 to 200 nsec) and such memory subsystem may be referred to as a storage-class memory. Conversely, other memory subsystems (e.g., an SSD or a HDD) may exhibit a latency in tens of microseconds (e.g., 50 to 100 µsec) and may be too slow to be considered as storage-class memory.

Another factor related to efficiencies of supplying information to a computing system may be a granularity of a unit of data. The granularity of a unit of data may refer to a minimum quantity of data (e.g., a number of bits storing information) that a component in a computing system may generate or utilize. By way of example, a typical size of a unit of data generated by an SSD may be 4,096 bytes whereas a processor (e.g., CPU) typically processes 64 bytes of data at a time. Efficiency of a processor may suffer when the processor waits for an SSD to produce data of 4,096 bytes (e.g., SSD's minimum data size) while the processor may only need data of 128 bytes in a transaction. Maintaining a granularity of a unit of data in a memory subsystem close to that of a processor of a computing system may be desirable to improve efficiency of the computing system.

A storage-class memory subsystem in the present disclosure may provide or exceed a desired latency (e.g., faster than NAND), a competitive cost (e.g., cheaper than DRAM), and a high bandwidth of data transfer rate (e.g., a data transfer rate of 25 gigabyte per second (GBps) each direction). The memory subsystem may be configured with a number of media ports to support a high performance of a host link in a computing system. The memory subsystem may be coupled with a host device through one or more host links. The memory subsystem may receive a request from the host (e.g., a host request) through the host link and interpret as a read or write request. The host request may be associated with a host address. The host device may identify an allowable address range by reading registers on a controller (e.g., a memory controller ASIC) in the memory subsystem. The memory subsystem may generate another command with an interleaved address based on the information in the host request to parallelize operations associated with the host request across multiple media ports.

An individual media port of the number of media ports may be coupled with a memory medium (e.g., 3D XPoint™ memory dice, which may be referred to as 3DXP dice). The memory subsystem may be configured to convert incoming host addresses to memory media addresses (e.g., addresses in 3DXP memory dice) with a low latency. The memory media may be referred to as physical media. Each media port may operate completely independent of each other and execute a separate media port logic algorithm to concurrently support the host links. Multiple media ports, while concurrently supporting the host links, may utilize an interleaved port address scheme that leaves no gap in a memory space from the host device's perspectives. In addition, the memory subsystem may generate a granularity of a unit of data (e.g., 64 bytes or 128 bytes depending on an energy efficiency setting) that the host device efficiently receive and process.

The memory subsystem may support a plurality of full duplex (e.g., dual simplex) host links. Each host link may be associated with a host address. Each host link may be organized as a single ×16, two ×8, or four ×4 configuration. The description ×8 or ×4 refers to a number of ingress (e.g., input) lanes and egress (e.g., output) lanes. By way of example, ×8 indicates 8 ingress lanes and 8 egress lanes within a host link. In some cases, each lane may support a data transfer rate of 8 gigabits per second (Gbps). The memory subsystem may be mounted in a computer system rack (e.g., a 2 U rack) and attached to a single ×8 host link or two ×8 host links. The memory subsystem may operate with a host device using a host interface protocol such as the Gen-Z protocol or the Cache Coherent Interconnect for Accelerators (CCIX) protocol to be compatible with legacy host interface protocols.

The memory subsystem may support a wear-leveling operation. The wear-leveling operation may distribute a number of program and erase cycles across a set of memory cells (i.e., a wear-leveling pool) in a memory media to avoid a certain subset of memory cells from accumulating an increased number of program and erase cycles when compared to the rest of the memory cells. In some cases, a limited reliability of non-volatile memory cells (e.g., FeRAM cells, 3DXP memory cells) in a memory media, which may stem from a limited program and erase cycling endurance capability of the memory cells, may adversely impact performance and lifetime of the memory media. The wear-leveling operation may extend the usable life of non-volatile memory cells that may exhibit a limited cycling capability. In addition, a malicious attack (e.g., due to a computer virus or unauthorized access) may attempt to destroy the non-volatile memory cells by continuously reading or writing a small fraction of the non-volatile memory cells until they reach their endurance limit. The wear-leveling operation of the memory subsystem may mitigate risks involved in non-volatile memory cell operation by either avoiding such malicious attacks or by effectively managing wear levels associated with the non-volatile memory cells.

The storage-class memory subsystem described in the present disclosure may be self-contained as a stand-alone device or may be an apparatus that may be attached to another device (e.g., a server). The method of operating the storage-class memory subsystem may be implemented in an ASIC or an interface chip. The method may be performed locally (e.g., in a server environment) or remotely (e.g., executed through a network).

Features of the disclosure introduced above are further described below in the context of FIG. 1. Specific examples are then described for FIGS. 2 through 5. These and other features of the disclosure are further illustrated by and described with reference to apparatus diagrams, system diagrams, and flowcharts that relate to a multi-port storage-class memory interface.

FIG. 1 illustrates an example of a computing system 100 that supports a multi-port storage-class memory interface in accordance with examples of the present disclosure. The computing system 100 may include a device 105. The device 105 may include a processor 130, an interface controller 120, and various memory devices 170, 175, and 180. The memory devices 170, 175, and 180 may be referred to as memory media. The device 105 may also include an input/output controller 135, a basic input/output system (BIOS) component 125, a board support package (BSP) 115, a peripheral component(s) 140, a direct memory access controller (DMAC) 160. The components of the device 105 may be in electronic communication with one another through a bus 110.

The device 105 may be a memory subsystem or memory component, computing device, electronic device, mobile computing device, or wireless device. The device 105 may be a portable electronic device. The device 105 may be a computer, a laptop computer, a tablet computer, a smartphone, a cellular phone, a wearable device, an internet-connected device, or the like. In some cases, the device 105 may be configured for bi-directional wireless communication with or via a base station or access point.

The processor 130 may be configured to operate with various memory media 170, 175, 180, or any combination thereof, either directly or via the interface controller 120. In some cases, the processor 130 may perform functions of the interface controller 120. The processor 130 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components.

The interface controller 120 may be configured to operate with the processor 130. In some examples, the interface controller 120 may be integrated as a part of the processor 130. The interface controller 120 may also be configured to operate with various memory media 170, 175, 180, or any combination thereof.

The memory media 170 may each include an array or arrays of memory cells to store digital information. The memory media 170 may be configured to operate with the processor 130, the interface controller 120, or both. In some examples, the memory media 170 may be configured to serve as a buffer memory for a memory bank for the processor 130 or the interface controller 120.

The memory media 175 may include a local controller configured to operate with an array of memory cells structured in two or more tiers. The local controller of the memory media 175 may also be configured to operate the processor 130 or the interface controller 120. The local controller of the memory media 175 may be configured to take advantage of different characteristics of memory cells to efficiently operate with the processor 130 or the interface controller 120. In some examples, first-tier memory cells may be 3DXP memory that may provide a high number of input/output operations per second (IOPS) with a short response time to handle various workloads. In some examples, second-tier memory cells may be three-dimensional NAND memory that may provide high capacity for data storage at a relatively lower cost than the first-tier memory cells. The memory media 175 may include other types or combinations of memory arrays in some cases.

The memory media 180 may include a local controller configured to operate with an array or arrays of memory cells. The local controller of the memory media 180 may also be configured to operate with the processor 130 or the interface controller 120. In some examples, memory cells may include non-volatile, or volatile memory cells, or a combination of non-volatile and volatile memory cells. In some examples, the local controller of the memory media 180 may be configured to handle a variable page size for a memory array where the memory array includes non-volatile memory cells, e.g., ferroelectric memory cells. In some examples, one or more memory media 180 may be present in device 105. In some examples, the local controllers of the memory media 180 may be configured to manage codewords divided across multiple memory dice where the memory dice include arrays of 3DXP memory cells. In some examples, the processor 130 or the interface controller 120 may be configured to receive portions of the divided codewords from the local controllers of the memory media 180 to generate the codewords in their entirety. In some examples, the 3DXP memory arrays may include a plurality of partitions (e.g., 32 partitions). Each partition of the plurality of partitions may be further configured to concurrently perform a task with other partitions.

The DMAC 160 may enable the processor 130 to perform direct memory accesses with the memory media 170, 175, or 180. For example, the DMAC 160 may support the processor 130 to directly access a memory medium 170, 175, or 180 without the involvement or operation of the interface controller 120.

The peripheral component(s) 140 may be an input or output device, or an interface for such devices, that may be integrated into the device 105. Examples may include a disk controller, a sound controller, a graphics controller, an Ethernet controller, a modem, a universal serial bus (USB) controller, a serial or parallel port, or peripheral card slots, such as peripheral component interconnect (PCI) or accelerated graphics port (AGP) slots. The peripheral component(s) 140 may be other components understood by those skilled in the art as peripherals.

The BIOS component 125 or the BSP 115 may be a software component that includes a basic input/output system (BIOS) operated as firmware, which may initialize and run various hardware components of the computing system 100. The BIOS component 125 or the BSP 115 may also manage data flow between the processor 130 and the various components, e.g., the peripheral components 140, the input/output controller 135. The BIOS component 125 or the BSP 115 may include a program or software stored in read-only memory (ROM), flash memory, or any other non-volatile memory.

The input/output controller 135 may manage data communication between the processor 130 and the peripheral component(s) 140, the input devices 145, or the output devices 150. The input/output controller 135 may also manage external peripherals that are not part of the device 105. In some cases, the input/output controller 135 may represent a physical connection or port to the external peripheral.

The input 145 may represent a device, a signal, or an interface external to the device 105 that provides input to the device 105 or its components. This may include a user interface or interface with or between other devices. In some cases, the input 145 may be a peripheral that interfaces with the device 105 via the peripheral component(s) 140 or may be managed by the input/output controller 135. In some examples, the input 145 may be a host link associated with a host device or a host interface.

The output 150 may represent a device, a signal, or an interface external to the device 105 configured to receive output from the device 105 or any of its components. Examples of the output 150 may include a display, audio speakers, a printing device, or another processor on printed circuit board, etc. In some cases, the output 150 may be a peripheral that interfaces with the device 105 via the peripheral component(s) 140 or may be managed by the input/output controller 135. In some examples, the output 150 may be a host link associated with a host device or a host interface.

The components of the device 105 may include circuitry designed to carry out various functions of the components. This may include various circuit elements, for example, conductive lines, transistors, capacitors, inductors, resistors, amplifiers, or other active or passive elements, configured to carry out the functions of the components described herein.

The device 105, in some examples, may be configured with one or more interface components and may receive an access command or a host request (e.g., through the input 145) from a host device (not shown). The interface components may be configured to be compatible with the Gen-Z or the CCIX protocol, among other examples. The host request (e.g., a read operation, a write operation) may be associated with a host address and the device 105 may generate a second command with an interleaved address based on the information in the host request to parallelize the operation across multiple media ports. In some examples, the device 105 may be configured to generate physical media addresses (e.g., addresses associated with the memory media 170, 175, or 180) with a low latency based on the incoming host addresses. The device 105 may then retrieve the data requested by the host (e.g., when the host request includes a read operation) from the multiple media ports as a result of or based on sending the second command to local controllers associated with the memory media (e.g., the memory media 175 or 180). Subsequently, the device 105 may generate a packet of data to send to the host (e.g., through the output 150) through the interface components in accordance with the protocol associated with the host link.

Figure 2:
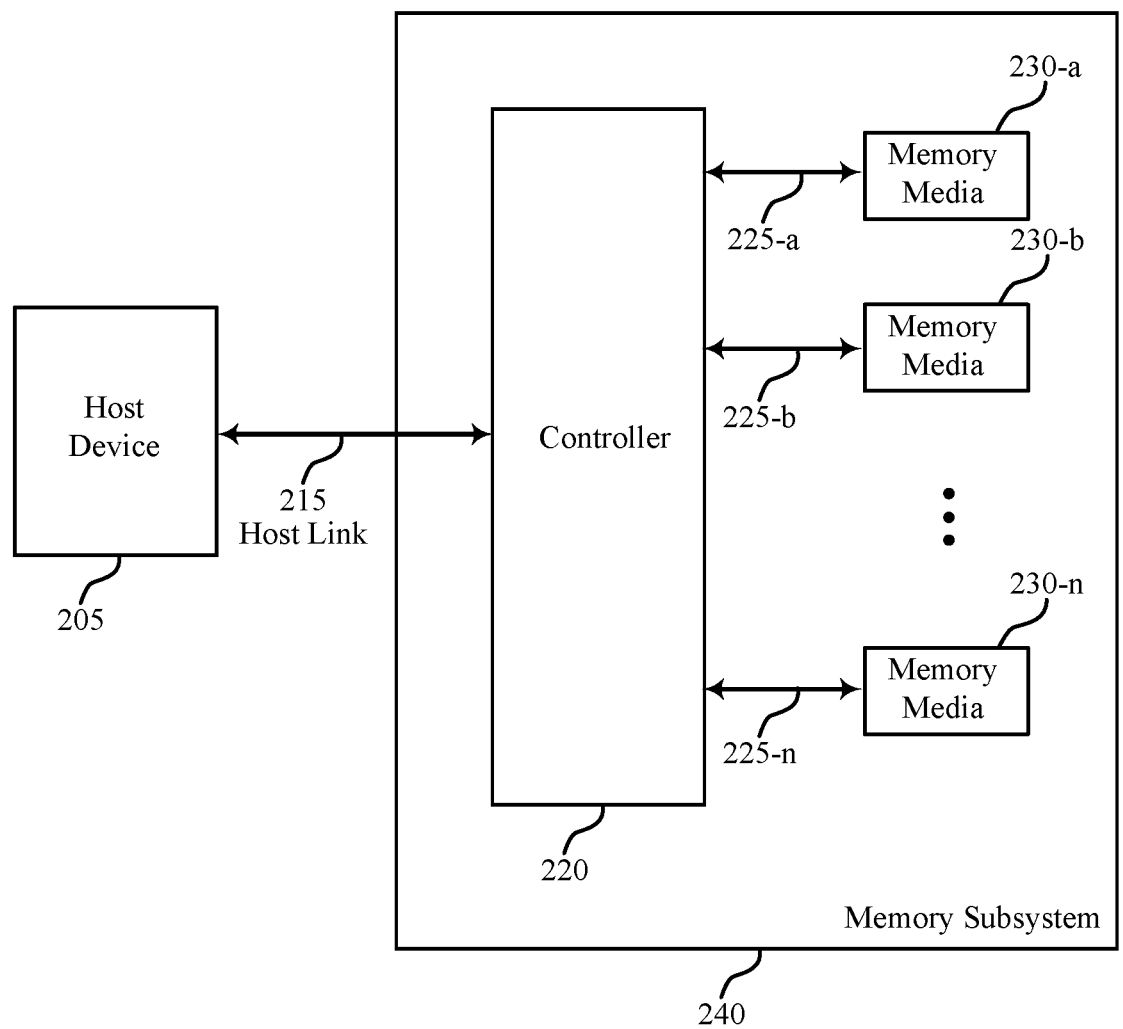
FIG. 2 illustrates an example of a computing system configured with an interface that supports a multi-port storage-class memory interface in accordance with examples of the present disclosure.

FIG. 2 illustrates an example of a computing system 200 configured with an interface that supports a multi-port storage-class memory interface in accordance with various examples of the present disclosure. The computing system 200 may be an example of the computing system 100 described with reference to FIG. 1. The computing system 200 may include a host device 205 coupled with a device 240 through a host link 215. The host device 205 may be a server, a system on a chip (SoC), or a central processing unit (CPU). In some examples, the host device 205 may access (e.g., read from, write to) one or more memory media 230 located in the device 240 through the host link 215. In addition, the host device 205 may set up registers to configure how to access the memory media 230.

The host link 215 may be an example of the input 145, the output 150, or a combination thereof, described with reference to FIG. 1. The host link 215 may employ a protocol (e.g., the Gen-Z, the CCIX protocol). In some examples, the host link 215 may be configured to transfer data at a data transfer rate (e.g., 25 gigabytes per second (GBps)) each direction (e.g., sending or receiving) through the host link. In some examples, a 25 GBps data transfer rate may support 586 million transactions per second when a transaction is 64 bytes. In other examples, a 25 GBps data transfer rate may support 312.5 million transactions per second when a transaction is 128 bytes.

The device 240 may be an example of the device 105 described with reference to FIG. 1. The device 240 may include a controller 220 that may be coupled with memory media 230 through aggregated channels 225. In some examples, the controller 220 and the memory media 230 may be integrated with, in contact with, or placed on a board (e.g., a peripheral component interconnect express (PCIe) board). In some examples, the device 240 may be referred to as a memory subsystem or a memory component. The controller 220 may include various functional blocks of the device 105 other than the memory media 170, 175, and 180 described with reference to FIG. 1. In some examples, the controller 220 may be an ASIC, a general-purpose processor, other programmable logic device, discrete hardware components, or it may be a combination of these types of components. In some examples, the controller 220 may receive, from the host device 205, a host request (e.g., an access command to read from or write to memory cells in the memory media 230) through the host link 215. In some examples, the controller 220 may generate a command including an interleaved address for the memory media 230 based on information in the host request (e.g., a host address). The interleaved addresses may be associated with the one or more memory media 230.

The controller 220, in some examples, may send the command including the interleaved address to local controllers (e.g., local controllers of the memory media 175 or 180 described with reference to FIG. 1) associated with the memory media 230. In some examples, the controller 220 may read data from or write data at the memory media 230 in conjunction with the local controllers performing various operations (e.g., writing data to memory cells, reading data from memory cells, arranging data in a format compatible with a configuration of the aggregated channels 225). In some examples, the local controllers may send requested data to the controller 220 through the aggregated channels 225. In some examples, the local controllers may send an indication of successful writing of data in response to receiving the command (e.g., a write command). In some examples, the controller 220 may store data received from the local controllers at cache memory (e.g., the cache 365-a described with reference to FIG. 3). In some examples, the controller 220 may assemble data packages containing contents of the memory media 230 to a consumable form that the host device 205 may use. The controller 220 may send the data packages to the host device 205 through the host link 215 in accordance with the interface protocol (e.g., the Gen-Z, the CCIX protocol).

An individual memory medium (e.g., the memory medium 230-a) of the memory media 230, in some examples, may include multiple memory dice (e.g., sixteen memory dice) to obtain a desired memory capacity. Each memory die may include the local controller (e.g., local controllers of the memory media 175 or 180 described with reference to FIG. 1) to collaborate with the controller 220 and to manage various memory operations within the memory die. In addition, the multiple memory dice within the individual memory medium may operate in parallel to generate a desired aggregated data transfer rate.

In some examples, the memory dice may include non-volatile memory cells (e.g., 3DXP array of phase change memory cells). In other examples, the memory dice may include non-volatile memory cells including a chalcogenide alloy. In some examples, a codeword (e.g., 128 bytes of a unit of data) may be divided across the multiple memory dice within the memory medium (e.g., the memory medium 230-a). The aggregated channels 225 may be configured to transport data between the controller 220 and the memory media 230 (e.g., the local controllers). In some examples, each of the aggregated channels 225 (e.g., the aggregated channel 225-a) may include a first number (e.g., eight) of logical channels for data transport. In some examples, each aggregated channel of the aggregated channels 225 (e.g., the aggregated channel 225-a) may include additional channels to carry information related to various auxiliary functions such as error-correction code (ECC) or metadata.

Figure 3:
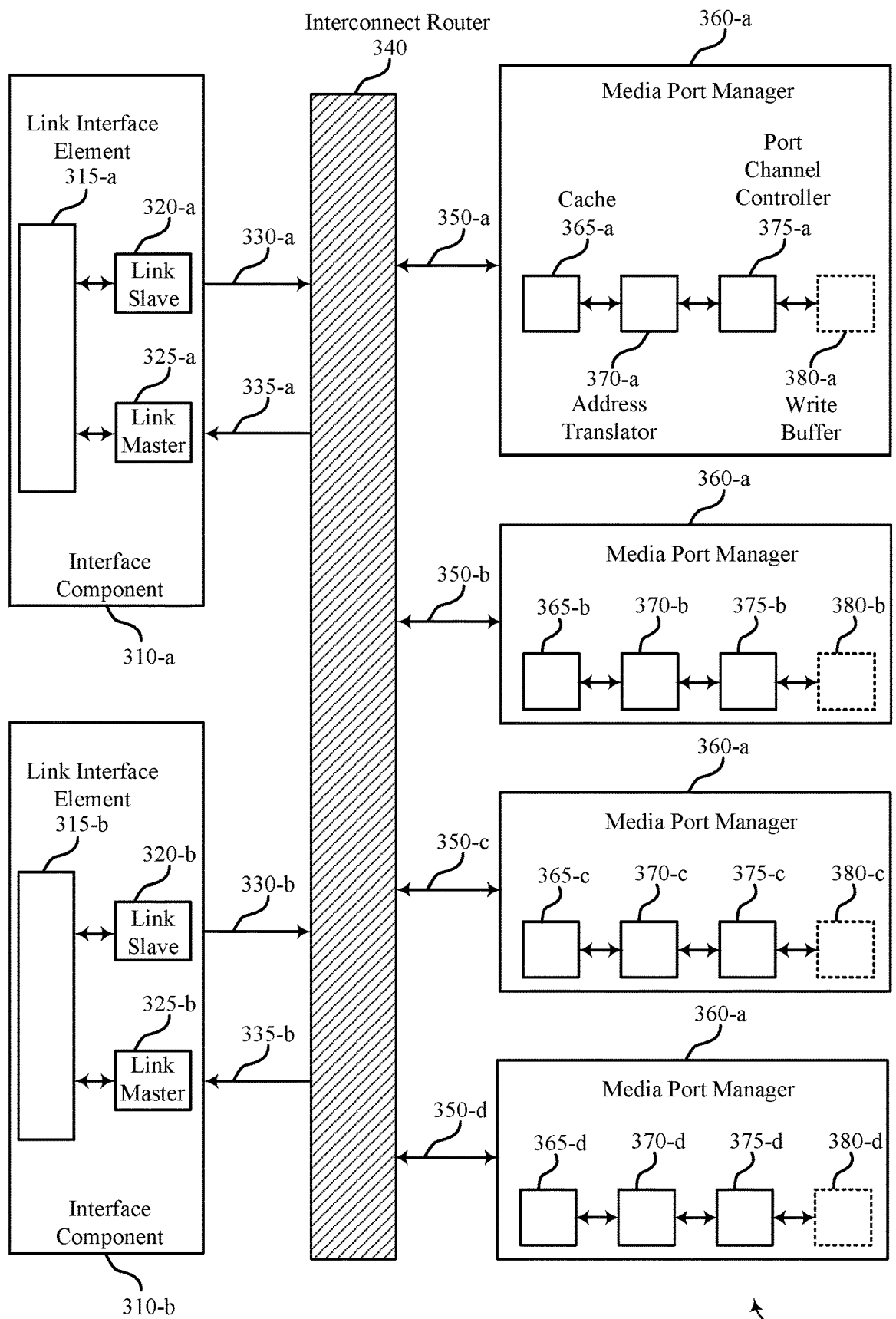
FIG. 3 illustrates an example of a device that supports a multi-port storage-class memory interface in accordance with examples of the present disclosure.
Figure 4:
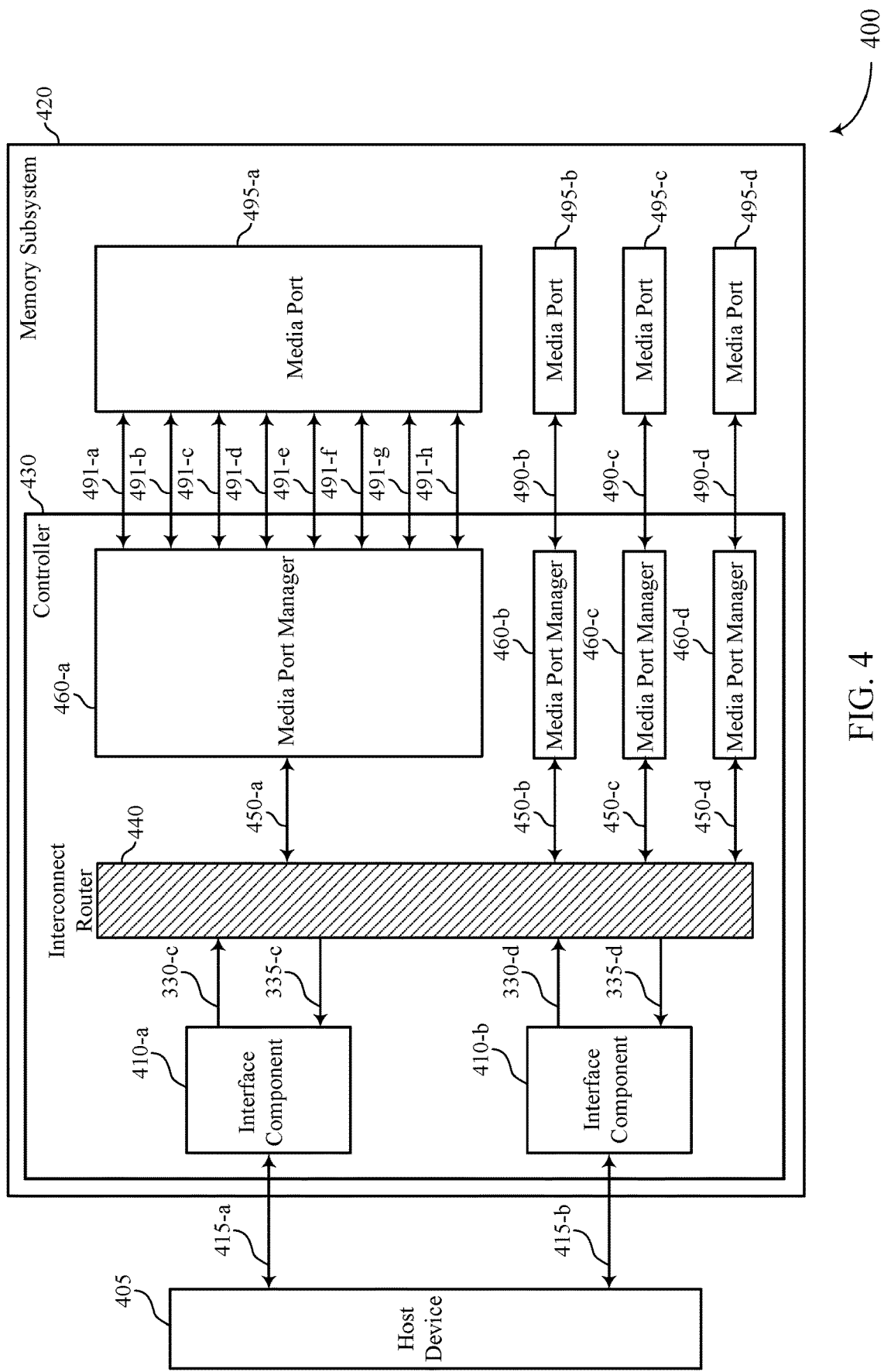
FIG. 4 illustrates an example of a computing system that supports a multi-port storage-class memory interface in accordance with examples of the present disclosure.

FIG. 3 illustrates an example of a device 300 that supports a multi-port storage-class memory interface in accordance with various examples of the present disclosure. The device 300 may be an example of the interface controller 120 or the controller 220 described with reference to FIGS. 1 and 2. In some examples, the device 300 may be an ASIC. The device 300 may include one or more interface components 310 that may be coupled with a host device (not shown) using a host link that employs an interface protocol (e.g., the Gen-Z protocol, the CCIX protocol) as explained above. The device 300 may also include an interconnect router 340 coupled between the interface components 310 and one or more media port managers 360. An individual media port manager (e.g., the media port manager 360-a) may be coupled with a memory medium using one of the aggregated channels 225 or 490 as depicted in FIGS. 2 and 4.

The interface components 310 may include a link interface element 315, a link slave 320, and a link master 325. The link interface element 315 may include physical layers for transmitting and receiving data through a host link coupled with a host device. In some examples, the link interface element 315 may be configured to transfer data at a first data transfer rate (e.g., 25 GBps) in each direction (e.g., sending or receiving) through the host link. The link slave 320 may receive a transaction-layer protocol packet through the host link and may decode the packet to extract a request from the host device as well as addresses and data associated with the request.

In some examples, the link slave 320 may send the decoded information to the interconnect router 340 at the first data transfer rate (e.g., 25 GBps) through a first signal path 330 (e.g., the first signal path 330-a). The link master 325 may generate a transactional-layer protocol packet and transmit the packet to the host through the host link. In some examples, the link master 325 may receive information from the interconnect router 340 at the first data transfer rate (e.g., 25 GBps) through a second signal path 335 (e.g., the second signal path 335-a). By way of example, the device 300 depicted in FIG. 3 includes two interface components 310-a and 310-*b* and may be capable of handling a total data transfer rate of 100 GBps when coupled with a host device using two host links, e.g., a first host link coupled with the interface component 310-*a* and a second host link coupled with the interface component 310-*b*. As a person of ordinary skill in the art would appreciate, however, other alternatives and different variations are specifically contemplated and fall within the scope of this disclosure.

The interconnect router 340, in some examples, may provide a routing network to allow more than one host link to connect to more than one media port associated with the media port managers 360. In some cases, the interconnect router 340 may be considered as an array of switches. By way of example, the device 300 depicted in FIG. 3 illustrates that the first host link, using the interface component 310-*a*, may connect to one or more media port managers (e.g., 360-*a*, 360-*b*, 360-*c*, and 360-*d*) while the second host link, using the interface component 310-*b*, may concurrently connect to the one or more media port managers (e.g., 360-*a*, 360-*b*, 360-*c*, and 360-*d*). During the routing process the interconnect router 340 may generate interleaved addresses from host addresses (e.g., sequential addresses designated with a block of memory space) to distribute the request from the host device across multiple media ports. So the host address (e.g., sequential addresses) may be in the domain of the interface component 310 while the interleaved addresses may be in the domain of the media port managers 360 and associated memory media. The interleaved addressing scheme may, in some examples, be configured to leave no gap in the block of memory space associated with the host address (e.g., sequential addresses). In some examples, the interconnect router 340 may exchange data with the media port managers 360 through third signal paths 350. In some examples, each path of the third signal paths (e.g., the third signal path 350-*a*) may be configured to exchange data at a second data transfer rate (e.g., 12.8 GBps) as described below.

An individual media port manager of the media port managers 360 may include a cache 365, an address translator 370, and a port channel controller 375. In some cases, an individual media port manager (e.g., the media port manager 360-*a*) may be capable of executing a separate media port logic algorithm so that each media port manager may operate completely independent of each other (e.g., media port managers 360-*b*, 360-*c*, or 360-*d*).

The cache 365 may include a fully-associated write-back cache and associated content-addressable memory (CAM). In some cases, CAM may search its memory space when presented with a data (e.g., content of an address) to see if the data are stored anywhere in CAM. Such CAM operation may consume relatively more power than a conventional memory (e.g., DRAM). The cache 365 may increase performance of the device 240 or the memory subsystem 420 described with reference to FIGS. 2 and 4. In some cases, the cache 365-*a* including CAM may facilitate the media port manager 360-*a* to determine whether content of an address presented is within the cache 365-*a* or not. The media port manager 360-*a* may fetch the content (e.g., from static random access memory (SRAM) within the cache 365-*a* when the content is found and thus avoiding additional latency) or take subsequent steps (e.g., determining to access a memory medium when the content is not found in the cache 365-*a* and accessing the memory medium associated with the media port manager 360-*a*).

A distributed-cache configuration may alleviate issues related to a power consumption associated with CAM in comparison to a centralized-cache configuration. By way of example, the distributed-cache configuration depicted in FIG. 3 (e.g., the cache 365-*a*, 365-*b*, 365-*c*, and 365-*d*) may reduce power consumption (e.g., down to one-fourth) compared to a single cache configuration because one or more caches (e.g., the cache 365-*a*, 365-*b*, 365-*c*, or 365-*d*) may be inactive for one or more CAM search operations. The distributed-cache configuration may also improve efficiency of the memory subsystem because each cache of the distributed-cache may operate independent of each other and distribute loading of cache to handle requests in parallel. In addition, the cache 365 may facilitate shielding the memory media from excessive transactions (e.g., read or write operations to memory cells) by distributing a number of read or write cycles within a wear-leveling pool. The cache 365 may also store data fetched from memory media before the link master 325 formulates packet response to send to the host. The cache 365 may operate using logical addresses (e.g., interleaved addresses associated with a set of media ports) described with reference to FIG. 5.

The address translator 370 may be associated with managing intra-zone wear-leveling operation described with reference to FIG. 5. The address translator 370 may include an address randomizer, a zone translate SRAM/table (ZTS), a base-free zone rotation logic, or a zone remap logic. Intermediate addresses, described with reference to FIG. 5, may be in the address translator 370.

The port channel controller 375 may include a command queue and associated conflict-control logic, a write data buffer, a media ECC encoder, a media ECC decoder, a read response queue, or an input/output for a memory medium. The port channel controller 375 may operate using physical addresses described with reference to FIG. 5.

In some cases, an individual media port manager of the media port managers may include a write buffer 380. The write buffer 380 may be configured to hold a write-to-read drift buffer (e.g., a write-to-read buffer) and associated CAM or a write victim cache and associated CAM. In some examples, the write buffer 380 may be configured to store data that is written to a memory medium within a certain time duration.

FIG. 4 illustrates an example of a computing system 400 that supports a multi-port storage-class memory interface in accordance with various examples of the present disclosure. The computing system 400 may be an example of the computing system 100 or 200 described with reference to FIGS. 1 and 2. The computing system 400 may include a host device 405 coupled with a memory subsystem 420 using host links 415. The host device 405 may be an example of the host device 205 described with reference to FIG. 2. The host links 415 may be an example of the host links 215 described with reference to FIG. 2. In some examples, the host link 415-*a* may be configured to transfer data at a data transfer rate (e.g., 50 GBps with 25 GBps in each direction). By way of example, the computing system 400 depicted in FIG. 4 may be configured to transfer data at a second data transfer rate (e.g., 100 GBps) in light of two host links such as the host link 415-*a* and the host link 415-*b*, which may each be configured to transfer data (e.g., 50 GBps).

The computing system 400 may include the memory subsystem 420. The memory subsystem 420 may be an example of the device 105 or the device 240 described with reference to FIGS. 1 and 2. The memory subsystem 420 may include a controller 430. The controller 430 may be an example of the device 300 described with reference to FIG. 3. The controller 430 may include one or more interface components 410, an interconnect router 440, and one or more media port managers 460. The interface components 410, the interconnect router 440, and the media port managers 460 may be an example of the interface components 310, the interconnect router 340, and the media port managers 360 described with reference to FIG. 3, respectively.

In some examples, an individual media port manager of the media port managers 460 (e.g., the media port manager 460-b) may be coupled with one of media ports 495 (e.g., the media port 495-b) through one of aggregated channels 490 (e.g., the aggregated channel 490-b). The media ports 495 may be examples of the memory media 230 described with reference to FIG. 2. An individual aggregated channel of the aggregated channels 490 may include one or more logical channels 491. In some examples, each of the aggregated channels 490 may include eight logical channels 491. Eight logical channels (e.g., the logical channel 491-a through the logical channel 491-h) are illustrated for the media port manager 460-a representing one of the aggregated channels 490 (e.g., the aggregated channel 490-a (not shown)) while the aggregated channels 490 (e.g., the aggregated channel 490-b, 490-c, and 490-d) are illustrated for media port managers 460-b, 460-c, and 460-d in an effort to increase visibility and clarity of the depicted features.

An individual media port of the media ports 495 (e.g., the media port 495-a), in some examples, may include one or more memory devices (e.g., memory devices with 3DXP memory cells, also referred to as 3DXP dice hereinafter). In some cases, the memory devices may operate in parallel to obtain a desired aggregated bandwidth through the aggregated channels 490. In some examples, one 3DXP die may have a memory capacity of 256 gigabits, e.g., 32 gigabytes. In some examples, one of the media ports 495 may include sixteen such 3DXP dice to generate a 512 gigabyte capacity, i.e., 0.5 terabyte capacity per a media port (e.g., the media port 495-a). In some examples, the 3DXP die may be configured to have a 8-bits wide data bus and two 3DXP dice may be assigned to each logical channel (e.g., the channel 491-a) rendering each logical channel 16-bits (e.g., two-bytes) wide. In some examples, an individual aggregated channel of the aggregate channels 490 may include eight logical channels (e.g., the aggregated channel 490-a including the logical channel 491-a through the channel 491-h). As a result, when sixteen 3DXP dice operate at 800 MHz in parallel, each of the aggregate channels 490 may operate at a bandwidth of 12.8 GBps (i.e., 2 bytes per the logical channel 491 leading to 16 bytes per the aggregated channel 490 (e.g., the aggregated channel 490-a) operating at 800 MHz). The above description may be understood from a logical view of the media ports. In some examples, a larger number of physical 3DXP dice than a number of logical 3DXP dice may be present in a media port accounting for an overhead related to memory operations associated with the media port.

Each 3DXP memory die, in some examples, may be configured to include a number (e.g., thirty-two) of partitions. Each partition of a 3DXP die may concurrently operate independent of the other partitions within the 3DXP die. In some examples, each logical channel (e.g., the logical channel 491-a) may be coupled with two 3DXP dice, thus a total of 64 partitions may be coupled with a logical channel (e.g., the logical channel 491-a). The controller 430 may access one partition of a 3DXP die coupled with a logical channel rotating through each media port.

By way of example using the memory subsystem 420 depicted in FIG. 4, the controller 430 may access a first partition (e.g., partition 1 out of 32 partitions) of a 3DXP die (e.g., 3DXP die A, not shown) in the media port 495-a. The controller 430 may then access a first partition (e.g., partition 1 out of 32 partitions) of a 3DXP die (e.g., 3DXP die B, not shown) in the media port 495-b. The controller 430 may then access a first partition (e.g., partition 1 out of 32 partitions) of a 3DXP die (e.g., 3DXP die C, not shown) in the media port 495-c. The controller 430 may then access a first partition (e.g., partition 1 out of 32 partitions) of a 3DXP die (e.g., 3DXP die D, not shown) in the media port 495-d. Then, the controller 430 may go back to the media port 495-a and access a second partition (e.g., partition 2 out of 32 partitions) of a 3DXP die (e.g., 3DXP die A, not shown) in the media port 495-a. The controller 430 may repeat the operations described above repeating a total of 64 times rotating through four media ports because two 3DXP dice are coupled to a logical channel rendering 64 partitions per logical channel.

Within a media port, a codeword may be divided into more than one die (e.g., a 128 byte codewords divided across four 3DXP dice). Such division may be feasible based on the nature of each partition operating independent of other partitions within a 3DXP die. In some cases, only one partition may be accessed per a transaction (e.g., one partition out thirty-two partitions within a 3DXP die) in conjunction with a number of parallel accessing across the number of 3DXP dice present in the media port as depicted by the parallel logical channels (e.g., the logical channels 491-a through 491-h). Such parallel operation may reduce a processing time associated with an error-correction code (ECC) operation on the information acquired by the divided codewords and parallel processing of the divided codewords across a number of 3DXP dice. The port channel controller 375 may handle the divided codewords and parallel processing of the divided codewords.

Various examples using 3DXP dice illustrate how the media ports 495 in the memory subsystem 420 may be configured and function in accordance with the methods, devices, and systems of the present disclosure. In some cases, the media ports 495 may include other memory devices employing different memory technologies than 3DXP technology. As such, the present disclosure is not limited to 3DXP dice.

As described above, the controller 430 may utilize the independent nature of the media port managers 460 (e.g., the media port manager 460-a operating independently of the other three media port managers 460-b, 460-c, and 460-d) and the independent nature of the memory media (e.g., one partition out of thirty-two partitions operating independently of the other thirty-one partitions in a 3DXP memory die) to acquire a desired data transfer rate with low latency to support a high-performance of the host links 415. The above examples are described to illustrate various functions of the controller 430 during its operation in the computing system 400 and the present disclosure may not be limited by these examples.

The interconnect router 440, in some examples, may be coupled between the interface components 410 and the media port managers 460. A third signal paths 450 between the interconnect router 440 and the media port managers 460 may be configured to exchange data between them. The third signal paths 450 may be an example of the third signal paths 350 described with reference to FIG. 3. In some examples, each of the third signal paths 450 (e.g., the third signal path 450-a) may be configured to exchange data at a rate (e.g., 12.8 GBps) in accordance with the examples described above. In some examples, the interface component 410 may send decoded information to the interconnect router 440 at a data transfer rate (e.g., 25 GBps) through a first signal path 330-c. In some examples, the interface component 410 may receive information from the interconnect router 440 at a data transfer rate (e.g., 25 GBps) through a second signal path 335-c.

As one example, the controller 430 depicted in FIG. 4 includes two interface components 410-a and 410-b and may be capable of handling a total data transfer rate of 100 GBps. In some examples, an overhead associated with a host link protocol may occupy a part of the total data transfer rate and an actual bandwidth of the computing system 400 may be less than 100 GBps (e.g., 80 GBps). In some examples, a total bandwidth produced by a plurality of media ports (e.g., 51.2 GBps through the third signal paths 450, for example, 12.8 GBps per each of the third signal paths 450) may not saturate the actual bandwidth that the controller 430 may be configured to handle (e.g., 80 GBps). In some examples, a total bandwidth produced by a plurality of media ports (e.g., 102.4 GBps through the third signal paths 450, namely 25.6 GBps per each of the third signal path 450) may be greater than the actual bandwidth that the controller 430 may be configured to handle (e.g., 80 GBps) and may saturate the maximum host link capacity (e.g., 100 GBps data transfer rate).

In some cases, the controller 430 may include at least one host interface configured to receive a first access command from a host device, a plurality of port managers configured to access one or more memory media using a second access command that comprises an interleaved address, and an array of switches coupled between the at least one host interface and the plurality of port managers, the array of switches configured to generate the interleaved address based at least in part on the first access command.

In some cases, each port manager of the plurality of port managers may include a cache, an address translator configured to facilitate a wear-leveling operation, and a channel controller configured to control a channel associated with the one or more memory media. In some cases, the cache is configured based at least in part on the second access command and further includes a fully-associated write-back cache or a fully-associated content addressable memory, or a combination thereof. In some cases, each port manager of the plurality of port managers further includes a write-to-read buffer configured to store data written to the one or more memory media. In some cases, the at least one host interface includes a link interface configured to receive or transmit a packet comprising data, a link slave configured to decode a received packet, and a link master configured to generate a packet to transmit. In some cases, each port manager of the plurality may be coupled with a three-dimensional cross-point array of phase change memory cells.

In some cases, the controller 430 may be configured to interface with a host device and a memory medium and operable to receive, from the host device, a first access command for the memory medium, generate a second access command comprising an interleaved address for the memory medium based at least in part on receiving the first access command, and send the second access command to a local controller at the memory medium. In some cases, the controller 430 may be operable to distribute access operations across the memory medium to control a wear level associated with a part of the memory medium. In some cases, the controller 430 may be operable to receive a divided codeword from a channel of the memory medium, wherein the channel comprises one or more memory devices. In some cases, the controller 430 may be operable to write data to the memory medium based at least in part on sending the second access command and store the data at a buffer, wherein the buffer is configured to retain the data that is written to the memory medium with a time duration. In some cases, the controller 430 may be operable to decode a first packet received from the host device to extract an access request and an address associated with the access request and generate a second packet to transmit to the host device based at least in part on extracting the access request.

Figure 5A:
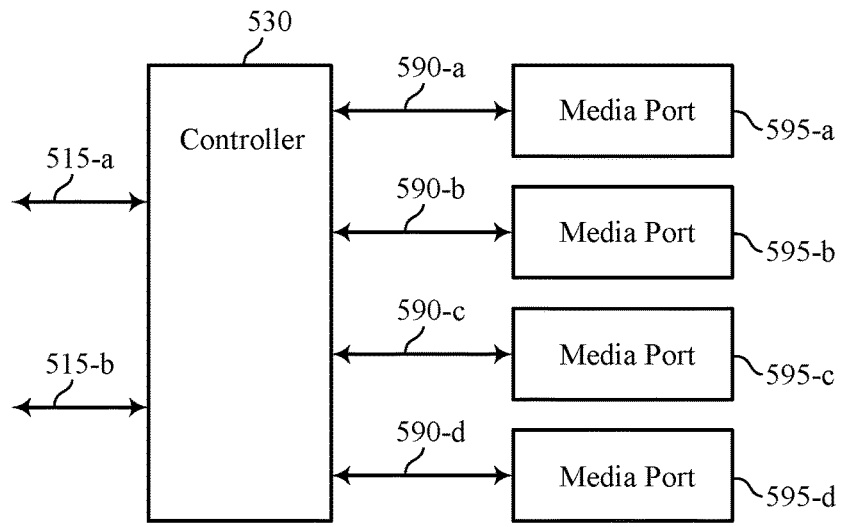
FIG. 5A illustrates an example of a memory subsystem that supports a multi-port storage-class memory interface in accordance with examples of the present disclosure.

FIG. 5A illustrates an example of a memory subsystem 501 that supports a multi-port storage-class memory interface in accordance with various examples of the present disclosure. The memory subsystem 501 may be an example of the device 105, the device 240, the memory subsystem 420 described with reference to FIGS. 1, 2, and 4. The memory subsystem 501 may include one or more host links 515, a controller 530, and one or more media ports 595. The host links 515 and the media ports 595 may be an example of the host links 415 and the media ports 495 described with reference to FIG. 4. The controller 530 may be an example of the processor 130, the controller 220, the device 300, or the controller 430 described with reference to FIGS. 1 through 4.

The controller 530 and the media ports 595 may exchange data through aggregated channels 590. The aggregated channels 590 may be examples of the aggregated channels 490 described with reference to FIG. 4. The aggregated channels 590 may be configured to support a data transfer rate (e.g., 12.8 GBps). In some examples, each media port of the media ports 595 (e.g., the media port 595-a) may be configured to have a memory capacity (e.g., 512 gigabytes). In some examples, each media port of the media ports 595 (e.g., the media port 595-a) may be configured to include a number of zones (e.g., 256×1,024 zones). In some examples, each zone of the number of zones may be configured to store a number of codewords (e.g., 16,384 codewords) in which each codeword may be 128 bytes large. In some examples, the number of zones in a media port may be fixed (e.g., 256×1,024 zones) and the size of codeword may be fixed (e.g., 128 bytes). A number of codewords that may be stored in each zone of the number of zones (e.g., 256×1,024 zones) of a media port may be determined based on a particular memory capacity of the media port.

Various addressing schemes may be utilized during operations of the memory subsystem 501. The following description illustrates an example of how the memory subsystem 501 depicted in FIG. 5 (e.g., the controller 530 coupled with four media ports 595, each media port configured with 512 gigabyte memory capacity) may operate with the various addressing schemes using a pure byte address form. Actual address form that may be implemented in the memory subsystem 501 may vary from the pure byte address form because various link interface protocols associated with the host links 515 may have different levels of truncation of addresses. For example, the Gen-Z protocol may have different truncation of addresses when compared to the CCIX protocol.

The memory subsystem 501 may receive, from a host device (not shown), a request associated with a host address. The host device may identify an allowable address range by reading registers on the controller 530 in the memory subsystem 501. As a way of example, the memory subsystem 501 may support a memory capacity of two terabytes (e.g., 512 gigabytes in each media port 595-a, 595-b, 595c, and 595-d). Two terabytes of memory capacity may be represented by addresses having 41 bits (e.g., A40 . . . A0, where A40 . . . A0 may represent a series of forty-one 0s and 1s in which A40 is the most significant bit (e.g., the 41st bit of the series of forty-one 0s and 1s) and A0 the least significant bit (e.g., the first bit of the series of forty-one 0s and 1s)).

For example, the host address may be associated with the addressing scheme having forty-one bits and may be considered as a sequential address. The lowest seven bits (e.g., A6 . . . A0) among forty-one bits may be allocated to designate one of 128 addresses within each codeword of 128 bytes. A codeword may be the smallest unit of data that the memory subsystem 501 may control (e.g., a granularity of 128 bytes). The next 2 bits of the 41 bits (e.g., A8 . . . A7) may be allocated to designate one of the four media ports. Remaining portion of the 41-bits host address (i.e., 32 bits of A40 . . . A9 out of A40 . . . A0) may be presented to each port (one of four media ports) and considered as a port logical address (PLA). It should be appreciated that once the logical address of the media port is determined, the addresses associated with PLA designates address spaces corresponding to one of the four media ports. Hence the port logical address may be considered as interleaved addresses across four media ports.

Each media port may be divided into a plurality of zones (e.g., 256×1,024 zones, i.e., 262,144 zones). Memory capacity of each zone (e.g., 2 megabytes, i.e., 2,097,152 bytes) of the plurality of zones may be further divided by a codeword size (e.g., 128 bytes) to determine a number of codewords that may be stored with each zone (e.g., 16,384 codewords of 128 bytes in each zone). The plurality of zones may facilitate a wear-leveling operation. Different zones within a media port may be utilized during the wear-leveling operation so that transactions (e.g., accessing memory cells of a media port) may be evenly distributed in time across the media port. In the example of 512 gigabyte media port, 18 bits of the 32-bits PLA may be allocated to designate one of 262,144 zones. The rest 14 bits of the 32-bits PLA may be allocated to designate one of 16,384 addresses to store codewords. One codeword of 16,383 codewords may be reserved as a blank space to allow intra-zone codeword rotation and only 16,383 of addresses may be used during wear-leveling operation.

The zone swapping and other supporting functions for the wear-leveling operation may be tracked by a zone translation SRAM/table (ZTS) in a media port manager (e.g., the media port managers 460 described with reference to FIG. 4). An 18-bit address contained in the ZTS may provide a lookup address to indicate a particular destination zone associated with the host request. In the present example of addresses having 41 bits, an intermediate address may be obtained by PLA div 16,383 in which div is an integer divide for the uppermost 18 bits producing the lower 14 bits as a remainder of the integer divide. The intermediate address may be referred to as the input address to the ZTS. Further, a physical address may be presented to a port channel controller (e.g., the port channel controller 375-a described with reference to FIG. 3). The upper portion of physical address may correspond to the lookup value retrieved from ZTS (e.g., designating one of 262,144 zones). The lower portion of physical address may be determined using the remaining 14 bits in conjunction with two pointers (e.g., a base pointer and a free pointer) facilitating intra-zone codeword rotation described with reference to FIG. 5B.

Figure 5B:
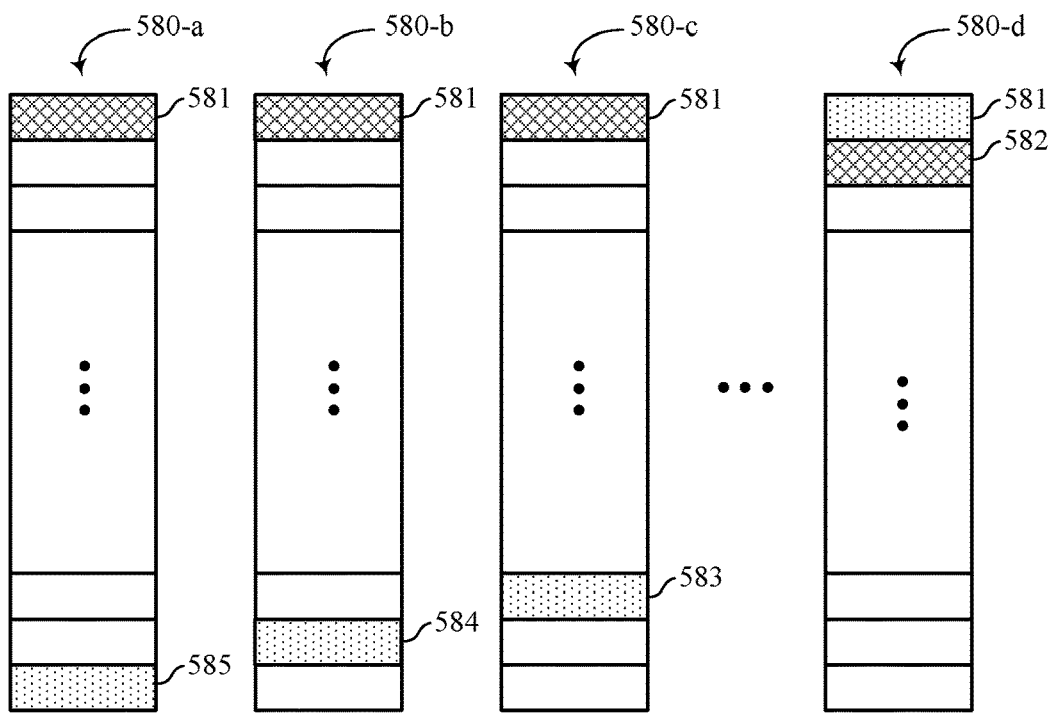
FIG. 5B shows a diagram illustrating a wear-leveling operation that supports a multi-port storage-class memory interface in accordance with examples of the present disclosure.

FIG. 5B shows a diagram 502 illustrating a wear-leveling operation that supports a multi-port storage-class memory interface in accordance with various examples of the present disclosure. The diagram 502 illustrates a zone diagram 580 at different stages of the wear-leveling operation. The zone diagram 580 may represent one of zones in a media port (e.g., a particular zone denoted as Zone_i) configured to store N codewords. Addresses of the N codewords within Zone_i are illustrated with the first codeword address 581, the second codeword address 582, the (N–2) codeword address 583, the (N–1) codeword address 584, and the N codeword address 585. In some examples, N may correspond to 16,384 and each codeword may be 128 bytes.

For example, Zone_i may be located in the media port 595-a that may configured to include 256×1,024 zones. Each codeword address may be designated with a physical address described above. Among N codeword addresses in the zone, one codeword address may be designated as a blank space identified with the free pointer. In addition, another codeword address may be designated as a base identified with the base pointer. The blank space in a zone may facilitate the intra-zone codeword rotation described below. The zone diagram 580-a illustrates Zone_i configured with the first codeword address 581 assigned with the base pointer and the last codeword address (e.g., the N codeword address 585) assigned with the free pointer.

The controller 530, when a host request including a codeword associated with a host address is presented, may identify a physical codeword address to store content of the codeword (e.g., when the host request includes a write operation). The controller 530 may determine a logical address associated with one of the media port (e.g., the media port 595-a) based on the host address. The interconnect router 440 may be associated with the process of determining the logical address based on the host address. Subsequently, the controller 530 may determine an intermediate address using the information in ZTS within a media port manager (e.g., the media port manager 460-a) designating a destination (e.g., Zone_i in the media port 595-a).

In some examples, the controller 530 may determine the physical codeword address within Zone_i based on locations of the base pointer and the free pointer. By way of example, the controller 530 may determine to store the content of the codeword at the N codeword address 585, which may be determined by the base pointer at the first codeword address 581 and the free pointer at the N codeword address 585 (e.g., determined by a relative distance in address space between the base pointer and the free pointer). Then, the controller 530 may move the free pointer to the (N–1) codeword address 584 as illustrated in the zone diagram 580-b.

When the controller 530 is presented with the codeword having the same host address by the host device next time, the controller 530 may store content of the codeword at the (N–1) codeword address 584 instead of the N codeword address 585 because of the different location of the free pointer. Then, the free pointer may be moved to the (N–2) codeword address 583 as illustrated in the zone diagram 580-c. Thus, the controller 530 may store the content of the codeword having the same host address to different physical addresses (i.e., different physical memory cells) due to the intra-zone wear-leveling operation. The wear-leveling operation may distribute multiple transactions (e.g., read or write operations to memory cells) in time to avoid excessive write or read operations to a particular physical portion of a memory media (e.g., 3DXP dice).

The controller 530 may move the base pointer to a different codeword address (e.g., the second codeword address 582) when the free pointer rotates through the entire codeword addresses within a zone while the base pointer is fixed at the first codeword address 581. The controller 530 may move the free pointer to the first codeword address 581 while the base pointer is fixed at the second codeword address 582 as illustrated in the zone diagram 580-d of Zone_i. Subsequently, the controller 530 may rotate the free pointer through Zone_i with respect to the base pointer located at the second codeword address 582. Further, the controller 530 may physically replace Zone_i with another zone of the media port (which may also be referred to as a zone swapping) to distribute transactions in time among the plurality of zones (e.g., 256×1,024 zones) within a media port (e.g., the media port 595-*a*).

The controller 530 may utilize a parameter to determine whether to relocate the free pointer, the base pointer, or both during the wear-leveling operation. Certain non-volatile memory technologies may exhibit different reliability characteristics depending on kinds of access operations performed on non-volatile memory cells. For example, a non-volatile memory cell may deteriorate more when a number of write operations are performed compared to the same number of read operations. The controller 530 may track a first number of write operations and a second number of read operations performed on memory cells of a physical address and generate the parameter associated with the physical address. The parameter may, in some examples, include a weight factor to appropriately allocate reliability risks associated with a kind of access operation (e.g., write operations having a larger weight factor than that of read operations). The controller 530 may estimate the parameter based on the weight factor associated with access operations and a total number of access operations to determine whether to relocate the free pointer, the base pointer, or both.

Thus, the memory subsystem 501 may be configured to avoid gaps in the host address while the memory subsystem 501 may have a plurality of media ports (e.g., media ports 595-*a* through 595-*d*) and the gaps in each of the media port (e.g., every 16,383 codewords). Various parts of the controller 530, described with reference to FIG. 3, may be configured to implement this feature as described herein.

The media port managers 360 may store the logical addresses of the transaction at the cache 365 (e.g., the cache 365-*a* of the media port manager 360-*a*) based on the interconnect router 340 of the controller 530 routing a host link (e.g., the host link 515-*a*) to one of the media port managers (e.g., the media port manager 360-*a*). Subsequently, the address translator 370 (e.g., the address translator 370-*a* of the media port manager 360-*a*) may generate intermediate addresses associated with the logical addresses.

In some examples, an intermediate address may correspond to a logical address divided by an integer divider (e.g., IA=LA div 16,383). In addition, the zone swapping and other support functions related to the wear-leveling operation may be tracked by a Zone Translation SRAM (ZTS) in the address translator 370. In some examples, the intermediate addresses may be input addresses to the ZTS. An eighteen-bit address (i.e., corresponding to 256 k zones) contained in the ZTS provides a look-up address to indicate the destination (i.e., a particular zone of the 256 k zones) of the request. Subsequently, the address translator 370 may generate physical addresses of 16,383 codeword spaces within a zone (i.e., 16,384 spaces less one space designated with the free pointer) by using a functional relationship including the free pointer and the base pointer locations (e.g., a modulo operation as a function of the free pointer location and the base pointer location within a zone). Subsequently, the port channel controller 375 may manage the physical addresses for storing content of the transaction at a particular physical location within the memory media.

The wear-leveling operation illustrated above may, in some examples, be concurrently executed for different media ports (e.g., the media port 595-*a* through the media port 595-*d*) due to a completely separate port logic algorithm. Thus, the memory subsystem 501 may maintain the host address without any discontinuity despite the number of memory media ports, gaps existing in the plurality of zones (e.g., every 16,383 codewords) in any one media port while the memory subsystem 501 may distribute a number of transaction evenly across the media port to avoid certain physical codewords or groups of codewords from accumulating excessive access.

Figure 6:
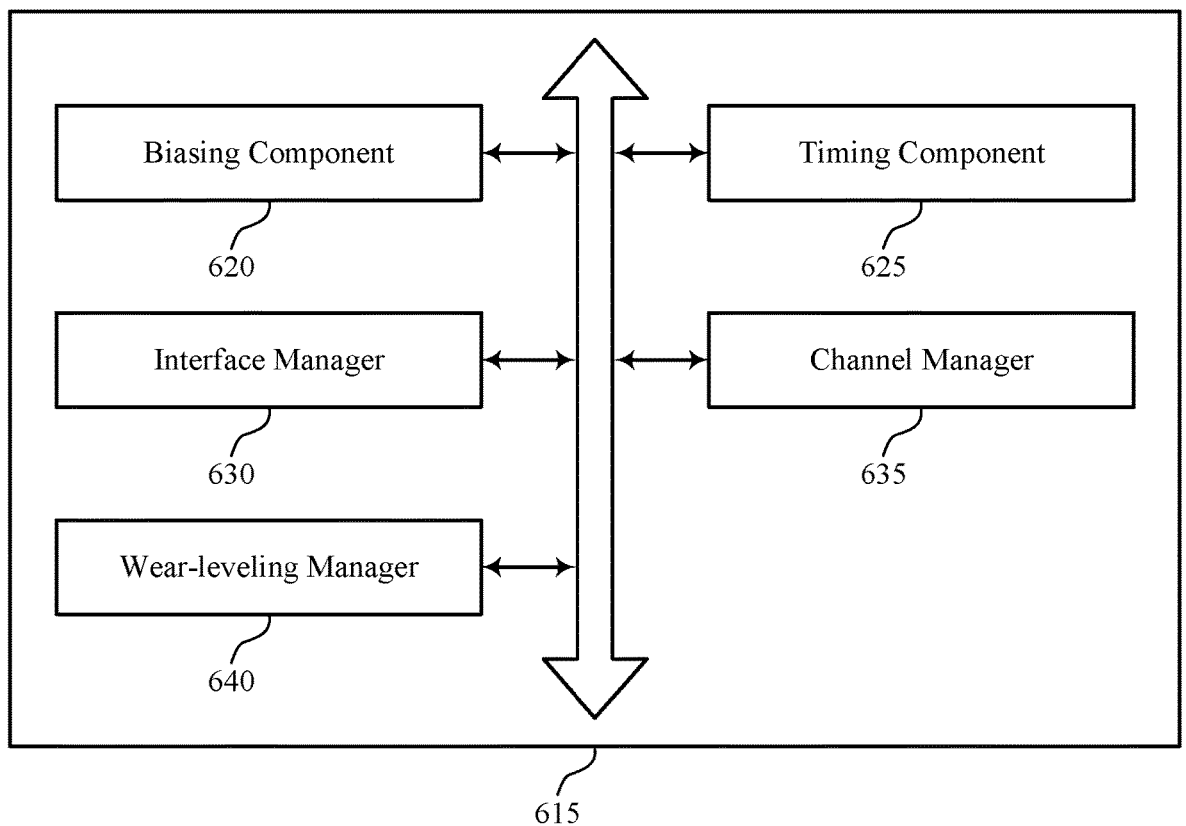
FIG. 6 shows block diagram of a device that supports a multi-port storage-class memory interface in accordance with examples of the present disclosure.

FIG. 6 shows a diagram 600 of a controller 615 that supports a multi-port storage-class memory interface in accordance with examples of the present disclosure. The controller 615 may be an example of aspects of the device 300, the controller 430, or the controller 530 described with reference to FIGS. 3 through 5. The controller 615 may include a biasing component 620, a timing component 625, an interface manager 630, a channel manager 635, and a wear-leveling manager 640. Each of these modules may communicate, directly or indirectly, with one another (e.g., via one or more buses).

The interface manager 630 may receive, from a host device, a first access command for a memory medium, and send the data to the host device in response to the first access command. In some cases, the interface manager 630 may packetize the data received from the local controller, and send a packet including the data to the host device in response to the first access command.

The channel manager 635 may generate a second access command including an interleaved address for the memory medium based on receiving the first access command, access the first zone of the second set of zones based on the physical address to read or write the at least one codeword, and read data from the memory medium based on sending the second access command. In some cases, the first access command includes a sequential address for the memory medium. In some cases, the first access command includes data indicative of content requested from or to store at the memory medium. In some cases, the channel manager 635 may access a cache memory based on generating the second access command, determine to access the memory medium based on accessing the cache memory, and receive data from the local controller at the memory medium in response to the second access command. In some cases, the channel manager 635 may send the second access command to a local controller at the memory medium, write data to the memory medium based on sending the second access command, and store the data at a buffer, where the buffer is configured to retain the data that is written to the memory medium within a time duration.

The channel manager 635, in some cases, may receive, from the local controller in response to sending the second access command, an indication that confirms successful writing of data associated with the second access command to the memory medium. In some cases, the memory medium includes a three-dimensional cross-point array of phase change memory cells. In some cases, the channel manager 635 may access the first zone of the first set of zones based on the physical address to read or write the at least one codeword, access the second zone to read or write the at least one codeword, store the data at the cache memory based on receiving the data.

The wear-leveling manager 640 may identify a first set of zones within a first memory medium, each zone of the first set of zones configured to store at least one codeword, select a first zone of the first set of zones based on a logical address of the at least one codeword, and determine a physical address of the at least one codeword based on a parameter associated with prior access operations and the logical address. In some cases, the wear-leveling manager 640 may select a second zone from the first set of the zones based on the weight, identify a second set of zones within a second memory medium, each zone of the second set configured to store at least one codeword, select a first zone of the second set of zones based on a logical address of the at least one codeword, and determine a physical address of the at least one codeword based on the parameter associated with prior access operations and the logical address. In some cases, the parameter includes a weight that is based on a first number of read operations associated with the physical address, or a second number of read operation associated with the physical address, or a combination thereof.

Figure 7:
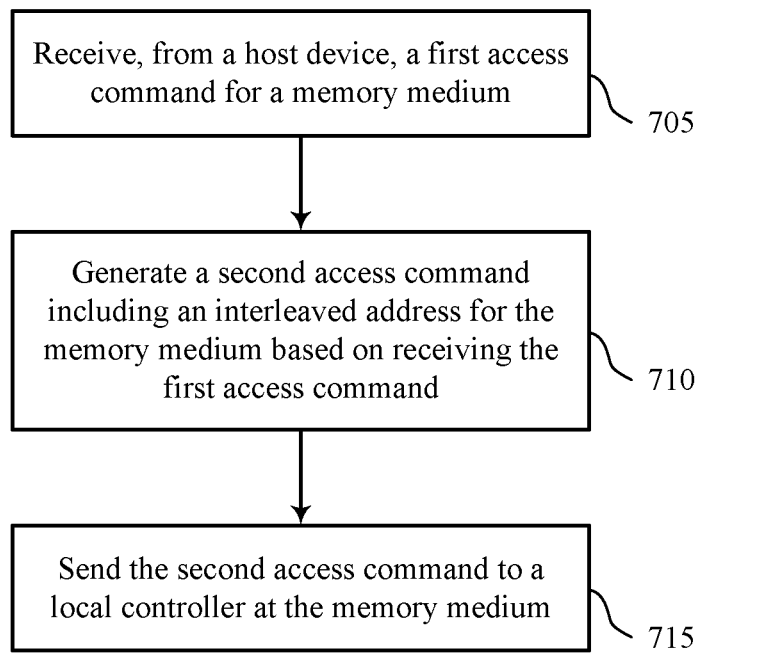
FIGS. 7 and 8 illustrate a method or methods supporting a multi-port storage-class memory interface in accordance with examples of the present disclosure.

FIG. 7 shows a flowchart illustrating a method 700 for a multi-port storage-class memory interface in accordance with examples of the present disclosure. The operations of method 700 may be implemented by a memory controller or its components as described herein. For example, the operations of method 700 may be performed by the device 300, the controller 430, or the controller 530, described with reference to FIGS. 3 through 5. In some examples, a controller may execute a set of codes to control the functional elements of the device to perform the functions described below. Additionally or alternatively, the controller may perform aspects of the functions described below using special-purpose hardware.

At block 705 the controller may receive, from a host device, a first access command for a memory medium. The operations of block 705 may be performed according to the methods described herein. In certain examples, aspects of the operations of block 705 may be performed by the interface manager 630 described with reference to FIG. 6.

At block 710 the controller may generate a second access command comprising an interleaved address for the memory medium based at least in part on receiving the first access command. The operations of block 710 may be performed according to the methods described herein. In certain examples, aspects of the operations of block 710 may be performed by the channel manager 635 described with reference to FIG. 6.

At block 715 the controller may send the second access command to a local controller at the memory medium. The operations of block 715 may be performed according to the methods described herein. In certain examples, aspects of the operations of block 715 may be performed by the channel manager 635 described with reference to FIG. 6.

In some cases, the method 700 may also include receiving, from a host device, a first access command for a memory medium. In some cases, the memory medium comprises a three-dimensional cross-point array of phase change memory cells. In some cases, the method 700 may also include sending the second access command to a local controller at the memory medium. In some cases, the first access command comprises a sequential address for the memory medium. In some cases, the first access command comprises data indicative of content requested from or to store at the memory medium. In some cases, the method 700 may also include reading data from the memory medium based at least in part on sending the second access command. In some cases, the method 700 may also include sending the data to the host device in response to the first access command. In some cases, the method 700 may also include accessing a cache memory based at least in part on generating the second access command. In some cases, the method 700 may also include generating a second access command comprising an interleaved address for the memory medium based at least in part on receiving the first access command.

In some cases, the method 700 may also include receiving data from the local controller at the memory medium in response to the second access command. In some cases, the method 700 may also include packetizing the data received from the local controller. In some cases, the method 700 may also include sending a packet comprising the data to the host device in response to the first access command. In some cases, the method 700 may also include storing the data at the cache memory based at least in part on receiving the data. In some cases, the method 700 may also include writing data to the memory medium based at least in part on sending the second access command. In some cases, the method 700 may also include storing the data at a buffer, wherein the buffer is configured to retain the data that is written to the memory medium within a time duration. In some cases, the method 700 may also include receiving, from the local controller in response to sending the second access command, an indication that confirms successful writing of data associated with the second access command to the memory medium. In some cases, the method 700 may also include determining to access the memory medium based at least in part on accessing the cache memory.

An apparatus is described. The apparatus may include means for receiving, from a host device, a first access command for a memory medium, means for generating a second access command comprising an interleaved address for the memory medium based at least in part on receiving the first access command, and means for sending the second access command to a local controller at the memory medium. In some cases, the first access command comprises a sequential address for the memory medium. In some cases, the first access command comprises data indicative of content requested from or to store at the memory medium. In some cases, the apparatus may further include means for reading data from the memory medium based at least in part on sending the second access command and means for sending the data to the host device in response to the first access command. In some cases, the apparatus may further include means for accessing a cache memory based at least in part on generating the second access command and means for determining to access the memory medium based at least in part on accessing the cache memory.

In some cases, the apparatus may further include means for receiving data from the local controller at the memory medium in response to the second access command, means for packetizing the data received from the local controller, and means for sending a packet comprising the data to the host device in response to the first access command. In some cases, the apparatus may further include means for storing the data at the cache memory based at least in part on receiving the data. In some cases, the apparatus may further include means for writing data to the memory medium based at least in part on sending the second access command and means for storing the data at a buffer, wherein the buffer is configured to retain the data that is written to the memory medium within a time duration. In some cases, the apparatus may further include means for receiving, from the local controller in response to sending the second access command, an indication that confirms successful writing of data associated with the second access command to the memory medium. In some cases, the memory medium comprises a three-dimensional cross-point array of phase change memory cells.

Figure 8:
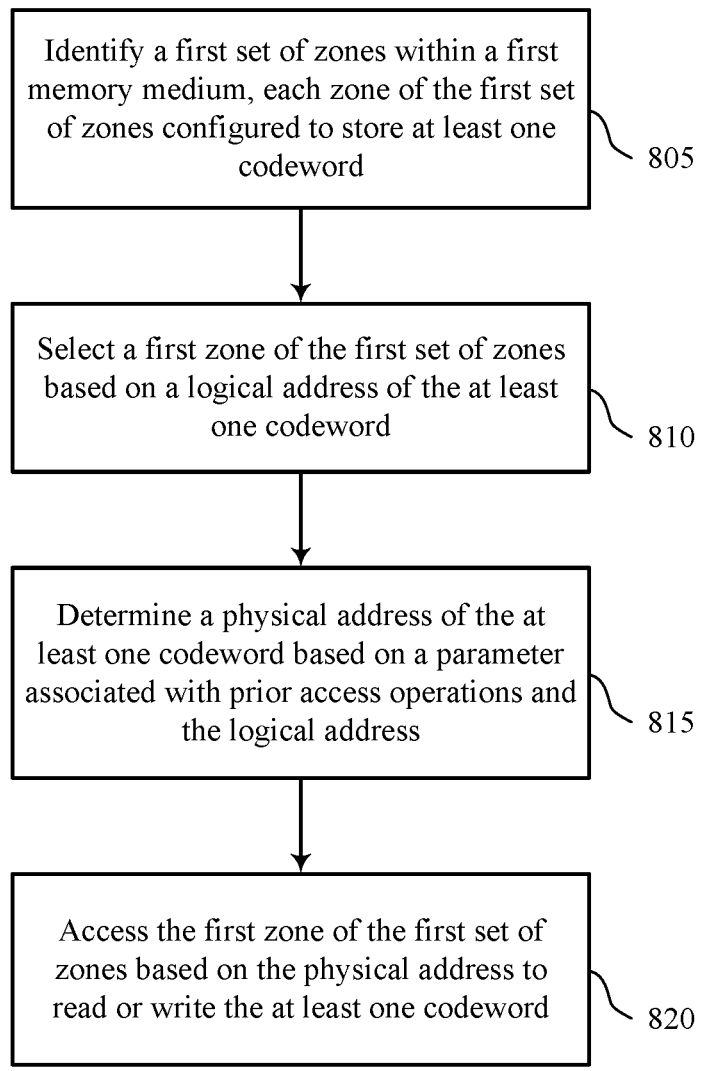

FIG. 8 shows a flowchart illustrating a method 800 for a multi-port storage-class memory interface in accordance with examples of the present disclosure. The operations of method 800 may be implemented by a memory controller or its components as described herein. For example, the operations of method 800 may be performed by the device 300, the controller 430, or the controller 530, described with reference to FIGS. 3 through 5. In some examples, a controller may execute a set of codes to control the functional elements of the device to perform the functions described below. Additionally or alternatively, the controller may perform aspects of the functions described below using special-purpose hardware.

At block 805 the controller may identify a first plurality of zones within a first memory medium, each zone of the first plurality of zones configured to store at least one codeword. The operations of block 805 may be performed according to the methods described herein. In certain examples, aspects of the operations of block 805 may be performed by the wear-leveling manager 640 described with reference to FIG. 6.

At block 810 the controller may select a first zone of the first plurality of zones based at least in part on a logical address of the at least one codeword. The operations of block 810 may be performed according to the methods described herein. In certain examples, aspects of the operations of block 810 may be performed by the wear-leveling manager 640 described with reference to FIG. 6.

At block 815 the controller may determine a physical address of the at least one codeword based at least in part on a parameter associated with prior access operations and the logical address. The operations of block 815 may be performed according to the methods described herein. In certain examples, aspects of the operations of block 815 may be performed by the wear-leveling manager 640 described with reference to FIG. 6.

At block 820 the controller may access the first zone of the first plurality of zones based at least in part on the physical address to read or write the at least one codeword. The operations of block 820 may be performed according to the methods described herein. In certain examples, aspects of the operations of block 820 may be performed by the channel manager 635 described with reference to FIG. 6.

In some cases, the method 800 may also include identifying a first plurality of zones within a first memory medium, each zone of the first plurality of zones configured to store at least one codeword. In some cases, the method 800 may also include determining a physical address of the at least one codeword based at least in part on a parameter associated with prior access operations and the logical address. In some cases, the method 800 may also include accessing the first zone of the first plurality of zones based at least in part on the physical address to read or write the at least one codeword. In some cases, the parameter comprises a weight that is based at least in part on a first number of read operations associated with the physical address, or a second number of read operation associated with the physical address, or a combination thereof. In some cases, the method 800 may also include selecting a first zone of the first plurality of zones based at least in part on a logical address of the at least one codeword.

In some cases, the method 800 may also include identifying a second plurality of zones within a second memory medium, each zone of the second plurality configured to store at least one codeword. In some cases, the method 800 may also include selecting a first zone of the second plurality of zones based at least in part on a logical address of the at least one codeword. In some cases, the method 800 may also include determining a physical address of the at least one codeword based at least in part on the parameter associated with prior access operations and the logical address. In some cases, the method 800 may also include accessing the first zone of the second plurality of zones based on the physical address to read or write the at least one codeword. In some cases, the method 800 may also include selecting a second zone from the first plurality of the zones based at least in part on the weight. In some cases, the method 800 may also include accessing the second zone to read or write the at least one codeword.

An apparatus is described. The apparatus may include means for identifying a first plurality of zones within a first memory medium, each zone of the first plurality of zones configured to store at least one codeword, means for selecting a first zone of the first plurality of zones based at least in part on a logical address of the at least one codeword, means for determining a physical address of the at least one codeword based at least in part on a parameter associated with prior access operations and the logical address, and means for accessing the first zone of the first plurality of zones based at least in part on the physical address to read or write the at least one codeword. In some cases, the parameter comprises a weight that is based at least in part on a first number of read operations associated with the physical address or a second number of read operation associated with the physical address, or a combination thereof.

In some cases, the apparatus may further include means for selecting a second zone from the first plurality of the zones based at least in part on the weight and means for accessing the second zone to read or write the at least one codeword. In some cases, the apparatus may further include means for identifying a second plurality of zones within a second memory medium, each zone of the second plurality configured to store at least one codeword, means for selecting a first zone of the second plurality of zones based at least in part on a logical address of the at least one codeword, means for determining a physical address of the at least one codeword based at least in part on the parameter associated with prior access operations and the logical address, and means for accessing the first zone of the second plurality of zones based on the physical address to read or write the at least one codeword.

It should be noted that the methods described above describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory media 230, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, from a host device, a first access command via a first channel having a first data transfer rate;
   generating a second access command comprising an interleaved address for a plurality of memory mediums based at least in part on receiving the first access command, wherein each memory medium includes a plurality of memory devices; and
   sending the second access command via a plurality of second channels to respective local controllers associated with the plurality of memory devices in each memory medium of the plurality of memory mediums concurrently, each second channel of the plurality of second channels having a second data transfer rate, wherein the second data transfer rate is based at least in part on the first data transfer rate and a quantity of the plurality of second channels.

2. The method of claim 1, wherein the first access command comprises a sequential address for the memory medium.

3. The method of claim 1, wherein the first access command comprises data indicative of content requested from or to store at the memory medium.

4. The method of claim 1, further comprising:
   reading data from the memory medium based at least in part on sending the second access command; and
   sending the data to the host device in response to the first access command.

5. The method of claim 1, further comprising:
   accessing a cache memory based at least in part on generating the second access command; and
   determining to access the memory medium based at least in part on accessing the cache memory.

6. The method of claim 5, further comprising:
   receiving data from the respective local controllers at the memory medium in response to the second access command;
   packetizing the data received from the respective local controllers; and
   sending a packet comprising the data to the host device in response to the first access command.

7. The method of claim 6, further comprising:
   storing the data at the cache memory based at least in part on receiving the data.

8. The method of claim 1, further comprising:
   writing data to the memory medium based at least in part on sending the second access command; and
   storing the data at a buffer, wherein the buffer is configured to retain the data that is written to the memory medium within a time duration.

9. The method of claim 1, further comprising:
   receiving, from the respective local controllers in response to sending the second access command, an indication that confirms successful writing of data associated with the second access command to the memory medium.

10. The method of claim 1, wherein:
    the memory medium comprises a three-dimensional cross-point array of phase change memory cells.

11. An apparatus, comprising:
    at least one host interface configured to receive a first access command from a host device via a first channel having a first data transfer rate;
    a plurality of port managers configured to concurrently access one or more memory media using a second access command that comprises an interleaved address, wherein each memory media include a plurality of memory devices; and
    an array of switches coupled between the at least one host interface and the plurality of port managers via a plurality of second channels having a second data transfer rate, wherein the second data transfer rate is based at least in part on the first data transfer rate and a quantity of the plurality of second channels, the array of switches configured to generate the interleaved address for the plurality of port managers based at least in part on the first access command.

12. The apparatus of claim 11, wherein each port manager of the plurality of port managers comprises:

a cache, an address translator configured to facilitate a wear-leveling operation, and a channel controller configured to control a channel associated with the one or more memory media.

13. The apparatus of claim 12, wherein the cache is configured based at least in part on the second access command and further comprises:
a fully-associated write-back cache or a fully-associated content addressable memory, or a combination thereof.

14. The apparatus of claim 12, wherein each port manager of the plurality of port managers further comprises:
a write-to-read buffer configured to store data written to the one or more memory media.

15. The apparatus of claim 11, wherein the at least one host interface comprises:
a link interface configured to receive or transmit a packet comprising data, a link slave configured to decode a received packet, and a link master configured to generate a packet to transmit.

16. The apparatus of claim 11, further comprising:
a three-dimensional cross-point array of phase change memory cells coupled to each port manager of the plurality.

17. An apparatus, comprising:
a controller configured to interface with a host device and a plurality of memory mediums, wherein the controller is operable to:
receive, from the host device, a first access command via a first channel having a first data transfer rate;
generate a second access command comprising an interleaved address for the plurality of memory mediums based at least in part on receiving the first access command, wherein each memory medium includes a plurality of memory devices; and
send the second access command via a plurality of second channels to respective local controllers associated with the plurality of memory mediums concurrently, each second channel of the plurality of second channels having a second data transfer rate, wherein the second data transfer rate is based at least in part on the first data transfer rate and a Quantity of the plurality of second channels.

18. The apparatus of claim 17, wherein the controller is further operable to:
distribute access operations across the memory medium to control a wear level associated with a part of the memory medium.

19. The apparatus of claim 17, wherein the controller is further operable to:
receive a divided codeword from the plurality of second channels of the memory medium, wherein each second channel of the plurality of second channels comprises one or more memory devices.

20. The apparatus of claim 17, wherein the controller is further operable to:
write data to the memory medium based at least in part on sending the second access command; and
store the data at a buffer, wherein the buffer is configured to retain the data that is written to the memory medium with a time duration.

21. The apparatus of claim 17, wherein the controller is further operable to:
decode a first packet received from the host device to extract an access request and an address associated with the access request; and
generate a second packet to transmit to the host device based at least in part on extracting the access request.

* * * * *